US010138542B2

(12) United States Patent
Hayward et al.

(10) Patent No.: US 10,138,542 B2
(45) Date of Patent: Nov. 27, 2018

(54) MECHANICALLY GATED ELECTRICAL SWITCHES BY CREASING OF PATTERNED METAL/ELASTOMER BILAYER FILMS

(71) Applicant: University of Massachusetts, Boston, MA (US)

(72) Inventors: Ryan C. Hayward, Northampton, MA (US); Dayong Chen, Sunderland, MA (US); Bin Xu, Tyne and Wear (GB)

(73) Assignee: University of Massachusetts, Boston, MA (US)

( * ) Notice: Subject to any disclaimer, the term of this patent is extended or adjusted under 35 U.S.C. 154(b) by 758 days.

(21) Appl. No.: 14/682,644

(22) Filed: Apr. 9, 2015

(65) Prior Publication Data
US 2015/0294805 A1  Oct. 15, 2015

Related U.S. Application Data

(60) Provisional application No. 61/978,582, filed on Apr. 11, 2014.

(51) Int. Cl.
*H01H 1/00* (2006.01)
*C23C 14/30* (2006.01)
*C23C 14/04* (2006.01)

(52) U.S. Cl.
CPC ............ *C23C 14/30* (2013.01); *C23C 14/042* (2013.01); *H01H 1/0036* (2013.01)

(58) Field of Classification Search
CPC .................................................... H01H 1/0036
See application file for complete search history.

(56) References Cited

U.S. PATENT DOCUMENTS

2014/0070338 A1* 3/2014 Wang .................... G06F 3/0414
257/415

OTHER PUBLICATIONS

Xu, B. et al., Mechanically Gated Electrical Switches by Creasing of Patterned Metal/Elastomer Bilayer Films—www.MaterialViews.com, Advanced Materials, Jul. 2, 2014 vol. 26, Issue 25, pp. 4381-4385.*

Bessono, et al., "Highly reproducible printable graphite strain gauges for flexible devices,", Sensors and Actuators A: Physical, 206, pp. 75-80, 2014.

(Continued)

*Primary Examiner* — J. San Martin
(74) *Attorney, Agent, or Firm* — Hamilton, Brook, Smith & Reynolds, P.C.

(57) ABSTRACT

Strain-gated logic devices are important for the development of advanced flexible electronics. Using a dual-monolayer-promoted film-transfer technique, a flexible multilayer structure capable of undergoing large compressive deformation was prepared. Formation of a crease in the gap between electrodes at a geometrically tunable strain leads to formation of an electrical connection in a reversible and reproducible fashion. A strain-gated electrical switch includes at least two conductive electrodes disposed on a surface of an elastomer substrate, the at least two conductive electrodes forming a gap between the at least two electrodes in an off-state of the strain-gated electrical switch, the gap diminishing under compressive strain to form a crease, the compressive strain pressing the at least two electrodes into contact with each other in an on-state of the strain-gated electrical switch.

13 Claims, 8 Drawing Sheets

(56) References Cited

OTHER PUBLICATIONS

Brau, et al., "Multiple-length-scale elastic instability mimics parametric resonance of nonlinear oscillators," Nature Physics, vol. 7, pp. 56-60, 2011.
Calvert, "Hydrogels for Soft Machines," Advanced Materials, 21, pp. 743-756, 2009.
Cao, et al., "From wrinkles to creases in elastomers: the instability and imperfection-sensitivity of wrinkling," Proceedings of the Royal Society A: Mathematical, Physical and Engineering Science, 468, pp. 94-115, 2012.
Chen, et al., "Surface Energy as a Barrier to Creasing of Elastomer Films: An Elastic Analogy to Classical Nucleation," Phys. Rev. Lett., 109, 038001, 2012.
Fukuda, et al., "A 4 V Operation, Flexible Braille Display Using Organic Transistors, Carbon Nanotube Actuators, and Organic Static Random-Access Memory," Advanced Funtional Materials, 21, pp. 4019-4027, 2011.
Genzer, et al., "Soft matter with hard skin: From skin wrinkles to templating and material characterization," Soft Matter, 2, pp. 310-323, 2006.
Jiang, et al., "Finite deformation mechanics in buckled thin films on compliant supports," Proceedings of the National Academy of Sciences, 104, pp. 15607-15612, 2007.
Hohlfeld, et al., "Unfolding the Sulcus," Physical Review Letters, 106, pp. 105702-105702-4, pp. 2011.
Hong, et al., "Persistent Step-Flow Growth of Strained Films on Vicinal Substrates," 95, pp. 095501-095501-4, 2005.
Jeong, et al., "Materials and Optimized Designs for Human-Machine Interfaces Via Epidermal Electronics," Adv. Mater., 25, 21 pages, 2013.
Kim, et al., "Stretchable and Foldable Silicon Integrated Circuits Science," 320, 507-511, 2008.
Kim, et al., "Epidermal Electronics," Science, vol. 333, 46 pages, 2011.
Kim, et al., "Dynamic display of biomolecular patterns through an elastic creasing instability of stimuli-responsive hydrogels," vol. 9, pp. 159-164, 2010.
Kim, et al., "Mimicking dynamic in vivo environments with stimuli-responsive materials for cell culture," Trends in Biotechnology, vol. 30, No. 8, pp. 426-439, 2012.
Kim, et al., "Large-scale pattern growth of graphene films for stretchable transparent electrodes," Nature, vol. 457, 706-710, pp. 2009.
Kim, et al., "Thin, Flexible Sensors and Actuators as 'Instrumented' Surgical Sutures for Targeted Wound Monitoring and Therapy," 8, No. 21, Small, pp. 3263-3268, 2012.
Ko, et al., "HA hemispherical electronic eye camera based on compressible silicon optoelectronics," Nature, vol. 454, pp. 748-753, 2008.
Lee, et al., "Electromechanical Computing at 500° C. with Silicon Carbide," Science, vol. 329, pp. 1316-1318, 2010.
Loh, et al., "Nanoelectromechanical contact switches," Nature Nanotechnology, vol. 7, pp. 283-295, 2012.
Lu, et al., "Buckling down for flexible electronics," Electronic Materials, Nature Nanotechnology, vol. 1, pp. 163-164, 2006.
Ma, et al., "Bio-Inspired Polymer Composite Actuator and Generator Driven by Water Gradients," Science, vol. 339, pp. 186-189, 2013.
Mannsfeld, et al., "Highly sensitive flexible pressure sensors with microstructured rubber dielectric layers," Nature Materials, vol. 9, pp. 859-864, 2010.
Pan, et al., "Sunlight-activated long-persistent luminescence in the near-infrared from Cr3C-doped zinc gallogermanates," Nature Materials, vol. 11, pp. 58-63, 2012.
Rogers, J.A., et al., A curvy, stretchy future for electronics, Proceedings of the National Academy of Sciences vol. 106, No. 27, pp. 10875-10876, 2009.
Won, et al., "Piezoresistive Strain Sensors and Multiplexed Arrays Using Assemblies of Single-Crystalline Silicon Nanoribbons on Plastic Substrates," Electron Devices, IEEE Transactions, vol. 58, pp. 4074-4078, 2011.
Schwartz, et al., "Flexible polymer transistors with high pressure sensitivity for application in electronic skin and health monitoring," Nat. Commun., 4, 8 pages, 2013.
Sekitani, et al., "Flexible organic transistors and circuits with extreme bending stability," Nature Materials, vol. 9, pp. 1015-1022, 2010.
Shahrjerdi, et al., "Extremely Flexible Nanoscale Ultrathin Body Silicon Integrated Circuits on Plastic," Nano Letters, vol. 13 (1), pp. 315-320, 2013.
Sun, et al., "Buckled and Wavy Ribbons of GaAs for High-Performance Electronics on Elastomeric Substrates," Adv. Mater., 18, pp. 2857-2862, 2006.
Takei, et al., "Nanowire active-matrix circuitry for low-voltage macroscale artificial skin," Nature Materials, vol. 9, pp. 821-826, 2010.
Wang, "Toward self-powered sensor networks," Nano Today, vol. 5, pp. 512-514, 2010.
Wang, et al., "Nanotechnology-Enabled Energy Harvesting for Self-Powered Micro-/Nanosystems," Angew. Chem. Int. Ed., vol. 51, pp. 11700-11721, 2012.
White, et al., "Ultrathin, highly flexible and stretchable PLEDs," Nature Photonics, vol. 7, pp. 811-816, 2013.
Wu, et al., "Strain-Gated Piezotronic Logic Nanodevices," Adv. Mater., 22, pp. 4711-4715, 2010.
Yu, et al., "GaN Nanobelt-Based Strain-Gated Piezotronic Logic Devices and Computation," vol. 7, No. 7, pp. 6403-6409, 2013.
Wu, et al., "Taxel-Addressable Matrix of Vertical-Nanowire Piezotronic Transistors for Active and Adaptive Tactile Imaging," Science, vol. 340, pp. 952-957, 2013.
Xu, et al., "BLow-Voltage Switching of Crease Patterns on Hydrogel Surfaces," Adv. Mater., 25, pp. 5555-5559, 2013.
Lu, et al., "Highly Sensitive Skin-Mountable Strain Gauges Based Entirely on Elastomers," Adv. Funct. Mater., 22, 7 pages, 2012.
Yoon, et al., "Local Switching of Chemical Patterns through Light-Triggered Unfolding of Creased Hydrogel Surfaces," Angew. Chem. Int. Ed., 51, pp. 7146-7149, 2012.
Zhang, et al. "Ultrathin Film Organic Transistors: Precise Control of Semiconductor Thickness via Spin-Coating," Advanced Materials, vol. 25, Issue 10, pp. 1401-1407, 2013.

* cited by examiner

MECHANICALLY GATED ELECTRICAL SWITCHES BY CREASING OF PATTERNED METAL/ELASTOMER BILAYER FILMS

RELATED APPLICATION

This application claims the benefit of U.S. Provisional Application No. 61/978,582, filed on Apr. 11, 2014.

The entire teachings of the above application are incorporated herein by reference.

GOVERNMENT SUPPORT

This invention was made with government support from the National Science Foundation under DMR-1309331 with additional work under grant DMR-0820506 to the UMass MRSEC. The government has certain rights in the invention.

BACKGROUND OF THE INVENTION

Flexible electronic devices based on lightweight, bendable, and stretchable polymer substrates offer considerable potential for applications including epidermal electronics, organic transistors, flexible circuits, displays, electronic eye cameras, artificial skins, sensors and actuators. See Kim, D., et al., *Science*, 838:333, 2001; Jeong J., et al., *Adv. Mater.* 25:6839, 2013; Zhang, F., et al., *Adv. Mater.* 25:1401, 2013; Sekitani, T., et al., *Nat. Mater.* 9:1015, 2010. Kim, D., et al. *Science*, 320: 507, 2008; Shahrjerdi, D., et al. *Nano Lett.*, 13:315, 2012; White, M. S., et al., *Nat Photon* 7:811, 2013; Fukuda, K., et al., *Adv. Funct. Mater*, 21:4019, 2011; Ko, H. C., et al. *Nature* 454:748, 2008; Takei, K., et al., *Nat. Mater.* 9:821, 2010; Wu, W., et al. *Science* 340:952, 2013; Mannsfeld, S. C. B, et al, *Nat. Mater.* 9:859, 2010; Kim, O. H., et al. *Small* 8:3263, 2012; Ma, M., et al. *Science* 339:186, 2013. While the ability to withstand bending and stretching without incurring damage to circuit elements comprised of hard materials—inorganic semiconductors, dielectrics, and metals—is a defining feature of any such device, many applications also benefit from the incorporation of elements that can sense deformation through changes in their electronic properties. Strain sensing in flexible electronic devices commonly relies on piezo-resistivity, i.e., changes in electrical resistance of materials under strain. See Sang, W., et al. *Electron Devices*, IEEE Transactions 58:4074, 2011; Yan, C., et al. *Adv. Funct. Mater.* 22:4044, 2012; Bessonov, A., et al. *Sensors and Actuators A: Physical* 206:75, 2014; Pang, C., et al., *Nat. Mater,* 11:1 2012. However, the development of strain-gated logic devices such as switches and transistors holds promise for improving the sensitivity of such devices and enabling more sophisticated mechano-electrical responses. See Lu, X., et al, *Nat Nano,* 1:163, 2006; Kim, K. S., et al., *Nature* 457:706, 2009; Sun, Y., et al. *Adv. Mater.* 18:2857, 2006; Rogers, J. A., et al. *Proceedings of the National Academy of Sciences* 106:10875, 2009; Hohlfeld, E. et al. *Phys. Rev. Lett* 106:105702, 2011; Cao, Y., et al. *Proceedings of the Royal Society A: Mathematical, Physical and Engineering Science* 468:94, 2012; Hong, W, et al. *Appl. Phys. Lett* 95:111901, 2005; Kim, J., et al. *Trends Biotechnol* 30:426, 2012; Kim, J., et al *Nat. Mater* 9:159, 2010; Chen, D., et al., *Phys. Rev. Lett.* 109:038001, 2012; Kim, J., et al. *Nat. Mater* 9:159, 2010; Calvert, P., *Adv. Mater* 21:743, 2009; Xu, B., et al., *Adv. Mater* 25:5555, 2013; Yoon, J. et al., *Angew. Chem. Int. Ed.* 51:7146, 2012. Approaches taken to date for strain-gated logic devices include the use of piezoelectric nanowire arrays and deformable microstructured gate dielectrics. See Wu, W., et al. *ACS Nano* 7:6403, 2013; Wu, W., et al, *Adv. Mater.* 22:4711, 2010; Mannsfeld, S. C, B., et al. *Nat. Mater* 9:859, 2010; Schwartz, G., et al. *Nat. Commun.* 4:1859, 2013.

There is, however, a continuing need for improving the sensitivity of such devices and enabling more sophisticated mechano-electrical responses.

SUMMARY OF THE INVENTION

While wrinkling and buckling mechanics have naturally played key roles in efforts to integrate hard electronic materials with soft polymer substrates, surface creases (singular, self-contacting features formed on the free surface of soft elastic solids under compression) have so far not been considered in this context. However, as crease formation can provide highly reversible changes in the connectivity between neighboring regions of material surfaces triggered in response to a wide variety of external stimuli, crease formation holds great potential for enabling new types of microelectronic devices.

In one embodiment, a strain-gated electrical switch includes at least two conductive electrodes disposed on a surface of an elastomer substrate, the at least two conductive electrodes forming a gap between the at least two electrodes in an off-state of the strain-gated electrical switch, the gap diminishing under compressive strain to form a crease, the compressive strain pressing the at least two electrodes into contact with each other in an on-state of the strain-gated electrical switch. The at least two electrodes can be gold electrodes, silver electrodes, electrically conductive polymer electrodes, or conductive polymer composite electrodes. The elastomer substrate can be a polydimethyl siloxane (PDMS) elastomer substrate, a polyurethane elastomer substrate, or the like. The gap between the at least two electrodes in the off-state of the strain-gated electrical switch can be in a range of between about 1 µm and about 100 µm, such as between about 10 µm and about 60 µm, or about 50 µm. The at least two electrodes can have a thickness in a range of between 5 nm and about 1 µm, such as between 20 µm and about 200 µm, or about 100 µm. The at least two electrodes can have a width in a range of between about 1 µm and about 1 mm, such as between about 10 µm and about 1 mm, between about 20 µm and about 200 µm, or about 100 µm.

In another embodiment, a method of a making strain-gated electrical switch includes forming a bilayer elastomer substrate including a stretched mounting layer and an adhesive elastomer layer, and depositing a photoresist layer on a silicon substrate coated with a self-assembled monolayer. The method further includes forming a pattern on the photoresist layer by photolithography, depositing a conductive film over the patterned photoresist layer, removing the photoresist layer to form a patterned conductive electrode layer, the patterned conductive electrode layer including at least two conductive electrodes forming a gap between the at least two electrodes, and transferring the patterned conductive electrode layer from the silicon substrate onto the bilayer elastomer substrate using the adhesive elastomer layer. The bilayer elastomer substrate can be formed of PDMS, a polyurethane elastomer, or the like. Depositing the patterned conductive electrode layer can include electron beam evaporation, sputtering, or direct printing of a conductive material onto the self-assembled monolayer. The conductive material can be metals, such as gold, or silver, electrically conductive polymers, or conductive polymer composites.

This invention has many advantages, such as enabling mechanically-gated logic devices that can be integrated with existing approaches to flexible electronics to provide more advanced responses to mechanical inputs, for example in tactile sensors, personal health monitoring devices, microfluidics, and MEMS/NEMS applications.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 7a-7b. (a) Observed hysteresis for a cycle of loading (squares) and unloading (circles) of a device with $L_g$=50 μm and W=100 μm, in accordance with an embodiment of the invention. 7(b) Measured strains for electrical connection (squares) and disconnection (circles) as a function of $L_g$, with a constant value of W=100 μm, in accordance with an embodiment of the invention.

DETAILED DESCRIPTION OF THE INVENTION

A description of example embodiments of the invention follows.

A strategy is demonstrated below for the use of creases in elastomeric substrates to yield strain-gated electrical switches with large on/off ratios and geometrically tunable strain sensitivities, in accordance with an embodiment of the invention. Devices consisting of micropatterned gold electrodes supported on polydimethylsiloxane (PDMS) elastomer substrates are fabricated using typical photolithographic methods, assisted by a dual self-assembled monolayer (SAM) assisted stamp transferring technique to place the electrodes on soft PDMS substrates. Under compression, the regions covered with gold form wrinkles at small strains due to the near inextensibility of the gold electrode film compared to the soft substrate. At higher compression, however, a crease forms in the gap between electrodes, pressing the electrodes into self-contact and lowering the electrical resistivity across the gap by many orders of magnitude. This process is highly reversible due to the elastic nature of creasing, and the switching strain can be tuned by the gap width due to the local amplification of strain by the stiff electrode films. While electro-mechanical switches that rely on deflection of slender cantilevers to reversibly form and break contacts in circuit elements are a well-established component of nano-electromechanical systems (NEMS)

devices, the current method offers a complementary approach that should facilitate integration with flexible electronic devices. See Wang, Z. L, *Nano Today* 5:512, 2010; Wang, Z. L., et al. *Angew. Chem. Int. Ed.* 51:11700, 2012; Lee, T. H., et al., *Science* 329:1316, 2010; Loh, O. Y., et al. *Nat Nano* 7:283, 2012.

Figures 1A, 1B:
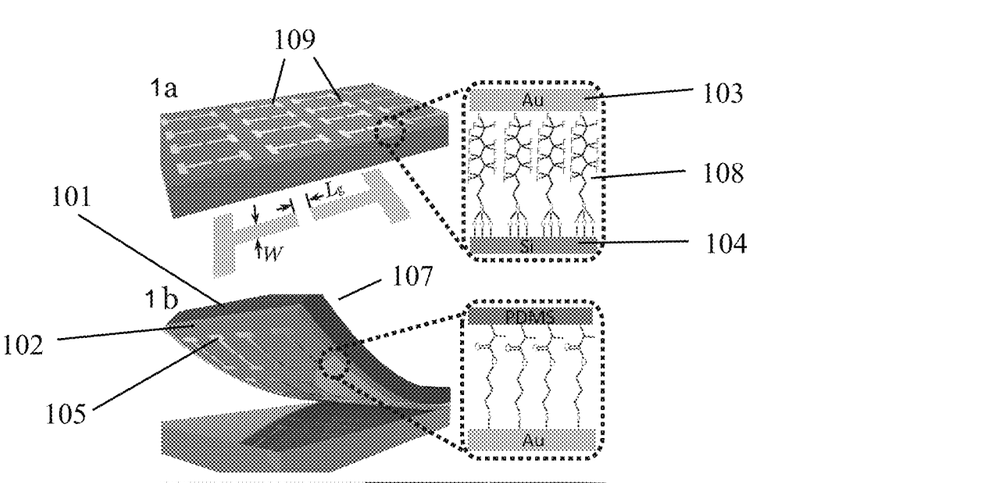
FIGS. 1a-1e. Dual-SAM assisted microelectrode transfer process and strain-gated switch design, in accordance with an embodiment of the invention. 1(a) Patterned gold electrodes on a silicon wafer coated with a fluorinated release SAM are 1(b) transferred to PDMS with the assistance of a methacrylate adhesion SAM. 1(c) A photograph of a fabricated device bent by hand to a tight radius of curvature—the scale bar is 1 mm. 1(d) An optical micrograph of an electrode array with W=20 μm and $L_g$=10 μm after transferring to PDMS; the electrode length is 250 μm, the thickness h is 100 nm, and the scale bar is 50 μm. 1(e) A schematic illustration of the self-contact of gold electrodes due to formation of a crease as the pre-stretch of the mounting layer is released.
Figure 1C:
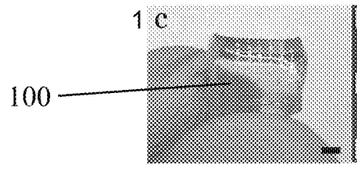
Figure 1D:
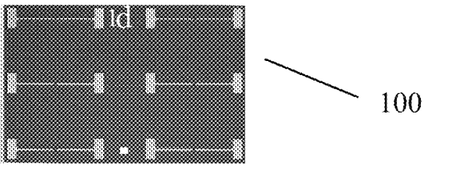
Figure 1E:
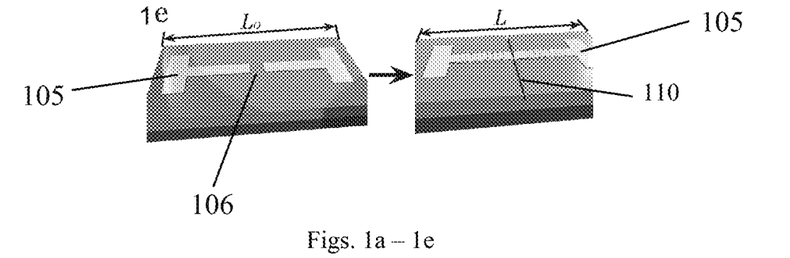

The fabrication method and device geometry are illustrated in FIG. 1a-1e, in accordance with an embodiment of the invention. A 1-mm-thick PDMS stretched mounting layer 101 (see FIG. 1b) is pre-stretched to length $L_0$ prior to coating with a thinner (45 μm) adhesive elastomer layer 102 of softer PDMS. Together, the stretched mounting layer 101 and adhesive elastomer layer 102 form a bilayer elastomer substrate 107. Separately, a gold film 103 (100 nm) is photo-lithographically patterned on a Si wafer 104 pre-treated with a release layer 108 (FIG. 1a), which may be a self assembled monolayer, such as a silane monolayer, to form a patterned conductive electrode layer 109. After lift-off, the gold electrodes 105 are treated with thiol adhesion promoter to promote subsequent anchoring to the PDMS surface 102 during film transfer (FIG. 1b). Upon subsequent release of the mounting layer 101 to a length L, the PDMS substrate/gold film bilayer is placed under compression, which is characterized by the nominal (far-field) uniaxial compressive strain $\varepsilon=L_0/L-1$. The resulting multilayer strain gated electrical switch devices 100 are highly flexible and can be bent tightly (FIG. 1c) without any visible damage to the electrodes. Typical device geometries consist of conductive electrodes 105 of width W=100 μm separated by a gap 106 of length $L_g$ ranging from 10-60 μm, as shown by optical microscopy in FIG. 1d, and illustrated including crease 110 in FIG. 1e. Although PDMS layers 101 and 102 are shown in FIGS. 1a-1e, it will be appreciated that other elastomer substrates may be used.

Figure 2A:
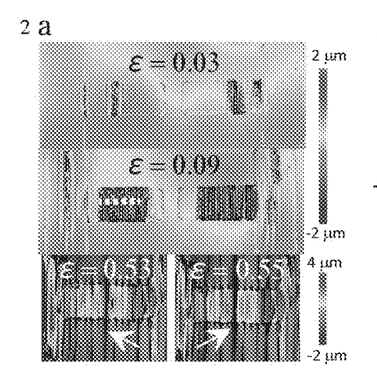
FIGS. 2a-2d. Characterization of instability modes for patterned bilayers under compression, in accordance with an embodiment of the invention. 2(a-b) Surface profiles for a device with W=100 μm, $L_g$=50 μm, and h=100 nm under various nominal compressive strains reveal a progressive wrinkling of the electrode surface (ε=0.03-0.09) followed by post-wrinkling bifurcations to a nearly period doubled state (ε=0.21) and more complex patterns (ε=0.44) prior to formation of a crease at ε=0.53 and contact of electrodes at ε=0.55. The one-dimensional profiles in 2(b) are taken in the location indicated by the white dotted line in 2(a) (ε=0.09). 2(c) The normalized amplitudes of surface features $A/\lambda_0$ reveal two post-wrinkling bifurcations with increasing strain. 2(d) The normalized compression in the gap, $\Delta L_g/L_g$ is plotted as a function of the nominal strain for different values of $L_g$: 60 μm (squares), 50 μm (circles), 40 μm (triangles), 20 μm (inverted triangles), and 10 μm (diamonds), with solid points indicating the presences of a crease. In all cases, gold electrodes with W=100 μm, h=100 nm, and length of 250 μm were used.
Figure 2B:
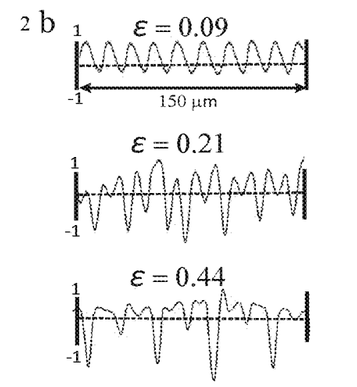
Figure 2C:
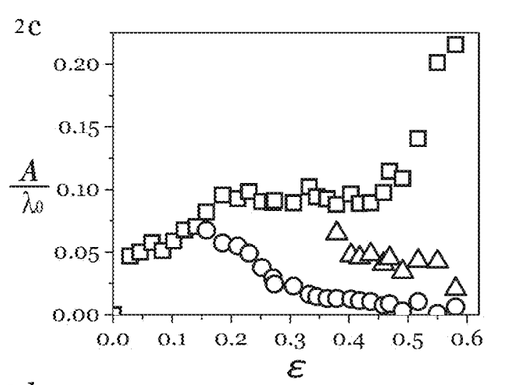
Figure 5:
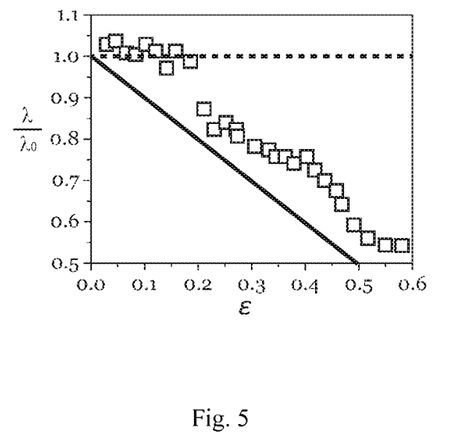
FIG. 5. The normalized wrinkle wavelength remains nearly constant until wrinkles cover the entire electrode finger, and then decreases with additional nominal strain (c), for a device in accordance with an embodiment of the invention with W=100 μm, Lg=50 μm, and h=100 nm. The predications of linear theory (dotted line) and non-linear theory $\lambda/\lambda_0=1-\varepsilon$, (solid line) are also indicated. See H. Jiang, et al., *Proceedings of the National Academy of Sciences*, 104, 15607, 2007.

Without wishing to be bound by theory, according to the critical wrinkling strain of $\varepsilon_W=0.25(3E_s/E_f)^{2/3}$ from linear stability analysis, wrinkle formation for a continuous gold film would be expected at a vanishingly small strain of $\varepsilon=1.9\times10^{-4}$ based on respective plane-strain elastic moduli of $E_f=98$ GPa and $E_s=667$ kPa for the gold film and PDMS substrate respectively. See Genzer, J., et al. *Soft Matter* 2:310, 2006; Jiang, H., et al., *Proceedings of the National Academy of Sciences* 104:15607, 2007. In practice, in accordance with an embodiment of the invention, wrinkles are found to cover parts of the electrode at a small compressive strain of $\varepsilon=0.03$ and expand to cover the majority of the electrode finger by $\varepsilon=0.09$ (FIG. 2a). The progressive wrinkling over this range of strain presumably reflects the influence of the gold film boundaries, as the in-plane dimensions of the electrodes are only several times larger than the wrinkle wavelength. The initial wavelength ($\lambda_0$) is predicted to be $\lambda_0=(2\pi h_f)(E_f/3E_s)^{1/3}$, or 23 μm for a gold film thickness of $h_f=100$ nm, which is in reasonable agreement with the measured value of 19 μm. Beyond a strain ε of about 0.1, when wrinkles grow to cover the whole electrode, further compression leads to a reduction in wavelength (FIG. 5) in agreement with previous findings. See Jiang, H., et al., *Proceedings of the National Academy of Sciences* 104: 15607, 2007; Brau, F., et al. *Nat. Phys.* 7:56, 2011. The normalized wrinkle amplitude ($A/\lambda_0$) is plotted in FIG. 2c, in accordance with an embodiment of the invention. For small strains, the amplitude grows in good agreement with the prediction $A/\lambda_0 \sim \varepsilon^{0.5}$ prior to the onset of period doubling at $\varepsilon \approx 0.17$, beyond which point every second wrinkle grows in amplitude while its neighbors shrink (FIG. 2b). See Genzer, J., et al. *Soft Matter* 2:310, 2006; Brau, F., et al. *Nat. Phys* 7:56, 2011. In accordance with an embodiment of the invention, at higher strains of $\varepsilon \approx 0.34$, a second bifurcation is found which apparently corresponds to the onset of period quadrupling and/or folding, although the surface profiles (e.g., in FIG. 2b at $\varepsilon=0.44$) are fairly irregular, perhaps due to the modest lateral extent of the electrodes compared to the wrinkle wavelength. See Brau, F., et al., *Nat. Phys.* 7:56, 2011.

Figure 2D:
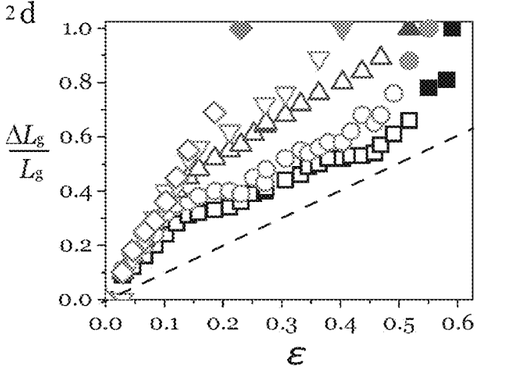

At even higher strains, a crease forms in the gap between the electrodes, followed soon after by contact of the electrodes. As shown in FIG. 2a, in accordance with an embodiment of the invention, for $L_g=50$ μm, these events occur at respective strains of 0.53 and 0.55. For the design of mechanically gated switches, without wishing to be bound by theory, it is important to understand how this crease-induced contact depends on electrode geometry. Thus, next, the normalized change of the in-plane distance between the electrode edges ($\Delta L_g/L_g$) is considered as a function of the nominal applied strain for different initial gap distances ($L_g$). As seen in FIG. 2d, in accordance with an embodiment of the invention, the in-plane distance between electrodes decreases faster than the case of affine deformation (dotted line), as expected since the greater stiffness of the gold-coated regions will cause compression to be disproportionately concentrated in the neighboring uncoated regions. This effect becomes more pronounced with decreasing $L_g$, with the amplification factor exceeding 4-fold for the smallest gap size studied ($L_g=10$ μm). The specific forms of the curves are not simple to understand, however, due to the wrinkling of the electrodes. In each case, the local strain in the gap eventually becomes sufficient to form a crease (as denoted by the filled symbols in FIG. 2d), which then grows in amplitude until the edges of the electrode first come into contact, i.e., corresponding to $\Delta L_g/L_g=1$.

Figure 3:
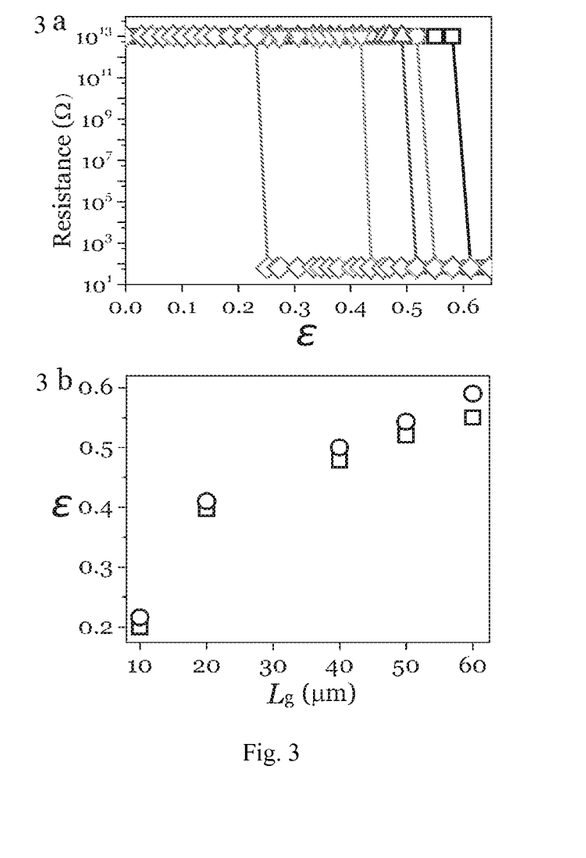
FIGS. 3a-3b. Characterization of strain-gated switching behavior, in accordance with an embodiment of the invention. 3(a) A decrease in resistance by about 11 orders of magnitude is observed upon contact of the electrodes, with the switching strain $\varepsilon_s$ showing a strong dependence on $L_g$: 10 μm (diamonds), 20 μm (inverted triangles), 40 μm (triangles), 50 μm (circles), 60 μm (squares). For these experiments, h=100 nm and W=100 μm. 3(b) Critical strains for crease formation $\varepsilon_s$ (circles) are shown as a function of $L_g$.
Figure 6A:
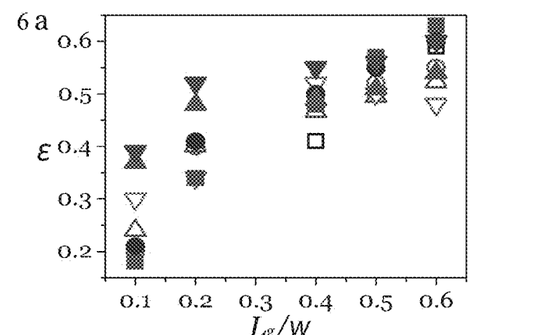
FIGS. 6a-6d. 6(a) The critical strains for creasing (open symbols) and switching (filled symbols) are plotted as a function of initial gap length $L_g$ normalized by electrode width W=100 μm for different gold electrode thickness: 200 nm (squares), 100 nm (circles), 50 nm (triangles), 20 nm (inverted triangles) in accordance with an embodiment of the invention. 6(b) Mechanically-gated switching resistance as a function of nominal strain for the same set of electrode thicknesses, in accordance with an embodiment of the invention, with $L_g$=50 mm and W=100 μm. In accordance with an embodiment of the invention, the on-state resistance is found to depend on electrode thickness, as shown in 6(c), while cross-sectional scanning electron microscopy of gold films on PDMS reveals good uniformity, for example as shown in 6(d); scale bar 100 nm.
Figure 6B:
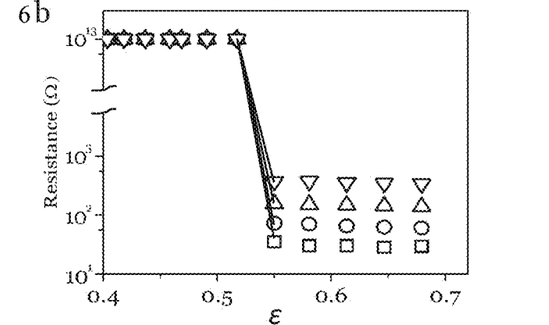
Figure 6C:
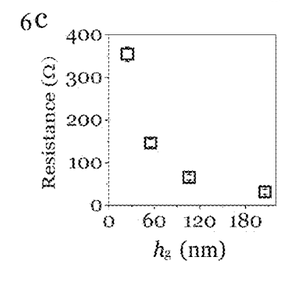
Figure 6D:
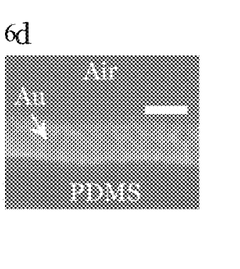

How the electrical resistance across the gap evolves with applied strain is next considered, as shown in FIG. 3a, in accordance with an embodiment of the invention. Prior to self-contact of the electrodes, the devices are highly insulating, with resistances of at least about $10^{13}\Omega$ (corresponding to the sensitivity limit of the test equipment), but upon self-contact these values drop to 55Ω for an electrode with a thickness of 100 nm and W=100 μm, representing an on/off ratio of at least about $10^{11}$. The calculated resistivity is 1100 nΩ·m, about 50 times higher than expected based on the value for bulk gold (22 nΩ·m), perhaps due to contact resistance between the micro-electrodes in the gap and/or between the large electrode pads and probes. Subsequent compression led to a slight decrease in resistance (FIG. 6) consistent with the reduction in effective electrode length as more of the gold surface is pressed into contact. Notably, the critical nominal strains to achieve this dramatic drop in resistance $\varepsilon_s$, match closely the values where $\Delta L_g/L_g=1$ as determined by optical microscopy, but exceed the strains for crease onset $\varepsilon_c$ by 0.01-0.05, since the amplitude of the crease must grow sufficiently large before the electrodes first contact (FIG. 3b). The resistivity of the strain-gated switches in the on state could be further tuned from about 50-350Ω through changes in the gold film thickness (FIG. 6), which was found to induce only small changes in the values of $\varepsilon_s$ and $\varepsilon_c$.

Figure 8:
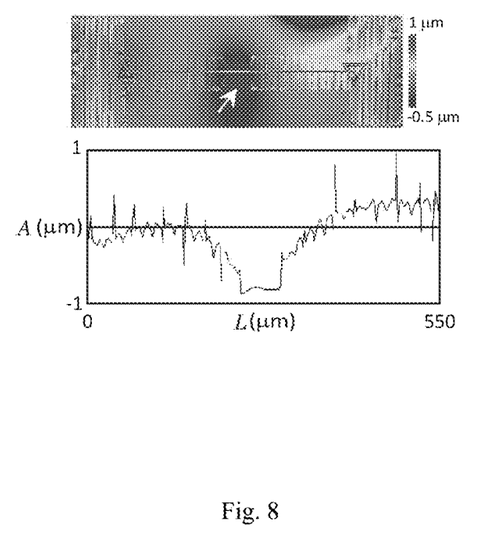
FIG. 8. A surface profile gathered about 15 s after the nominal strain was re-set from 0.6 to 0, following cyclic testing of device performance, in accordance with an embodiment of the invention. Remaining wrinkles on the metal electrode and a depression in the gap, which both decay over time, reveal an important role of viscoelastic relaxation for this formulation of the soft PDMS layer.

A key advantage of the creasing instability in this context is that, as an elastic process, it should yield a high degree of repeatability. For example, the resistivity of the device through 10 cycles is shown, each accomplished by first loading a device to above $\varepsilon_s$ and subsequently reducing the nominal strain until beyond the point where contact was broken. A slight hysteresis of about 0.03 in c is found between loading and unloading cycles (FIG. 7). This hysteresis may arise due to the viscoelastic nature of the substrate, and/or the influence of surface adhesion. Over this number of cycles, no degradation or delamination of the electrodes was observed, and the resistivity in the on state and switching strain were found to be nearly constant with respective variabilities of ±5Ω and ±0.004. The importance of loading rate was further characterized, as shown in FIG. 4b, in accordance with an embodiment of the invention. With increasing average strain rates over the range of $1.7 \times 10^{-5}$-$3.4 \times 10^{-3}$ s$^{-1}$, a decrease in $\varepsilon_s$ by 0.1 was observed. Furthermore, when the nominal strain was set to zero following cyclic testing, the surface profile (FIG. 8) showed residual out of plane deformation which required a time scale of about 300 s to fully relax. These observations suggest that the viscoelastic relaxation of the soft PDMS layer used here is important, at least at the faster loading/unloading rates studied. While logic elements that are strain-rate gated rather than simply strain gated could be useful in some cases, it is noted that further modifications to the properties of the elastomer layer should enable a reduction in the magnitude and/or time-scale of this stress relaxation behavior.

In summary, a dual-SAM assisted stamp transferring technique was used to fabricate strain-gated switches in accordance with an embodiment of the invention that rely on the formation of surface creases in a patterned metal/elastomer bilayer device to bring initially disconnected regions of the electrode into self-contact. This leads to changes in device resistivity by about 11 orders of magnitude at a geometrically-tunable switching strain, with good repeatability over multiple cycles. It is anticipated that such mechanically-gated logic devices can be integrated with existing approaches to flexible electronics to provide more advanced responses to mechanical inputs, for example in tactile sensors, personal health monitoring devices, microfluidics, and MEMS/NEMS applications.

As used herein, a "crease" is a singular, self-contacting feature formed on the free surface of a soft elastic solid under compression.

EXEMPLIFICATION

PDMS bilayer fabrication: The mounting layer was made from 99.997% fumed silica reinforced vinyl terminated PDMS (Part A, DMS-V31S15, Gelest Inc.) containing 0.003% platinum catalyst (SIP6831.2) and 90% vinyl terminated PDMS (Part B, DMS-V31) containing 10% trimethylsiloxy terminated methylhydrosiloxane-dimethylsiloxane copolymer (HMS-301) with a weight ratio of Part A/Part B=3. After mixing and degassing under 1 mTorr for 15 min, the solution was slowly poured in a petri dish, and kept in a standard convection oven for curing at 120° C. for 8 h. The cured PDMS film was 1-1.2 mm in thickness, and a stripe of PDMS of about 6×20 mm was cut and pre-stretched on a uniaxial mechanical strain stage. The soft PDMS layer with thickness of 45 μm (Sylgard 184, Dow Corning, 40:1 for base:crosslinker) was prepared by spin-coating the degassed mixture on a polystyrene plate (about 1 cm$^2$) at 1000 rpm for 120 s, followed by curing at 70° C. for 1 h. An adhesive PDMS layer with the same composition of 40:1 was spin-coated on this cured layer at 3000 rpm for 120 s, to bond to the mounting layer. After transferring the adhesive coated soft PDMS layer to the mounting layer, the assembly was held at 70° C. for 8 h to cure the adhesive layer.

Microelectrode fabrication and SAMs assisted stamp transferring: After cleaning a silicon wafer in a Piranha solution ($H_2SO_4/H_2O_2$=3:1, volume ratio) for 15 min, followed by standard photo-lithographic techniques to pattern a 1.5 μm thick film of photoresist, a SAM of (tridecafluoro-1,1,2,2-tetrahydrooctyl)trichlorosilane (Gelest) was applied from the vapor phase at room temperature for 30 min to facilitate subsequent release of the gold film. Electrodes were then patterned by e-beam evaporation of Au followed by lift-off in acetone. To enhance the adhesion between the gold and PDMS, the gold electrodes were treated by a solution of 0.5 M bis(2-methacryloyl)oxyethyl disulfide (Sigma-Aldrich) in ethanol for 10 min to promote attachment of the gold to the PDMS surface. A load of about 5 g/cm$^2$ was applied for 5 min when transferring the gold to the PDMS surface.

Figure 4:
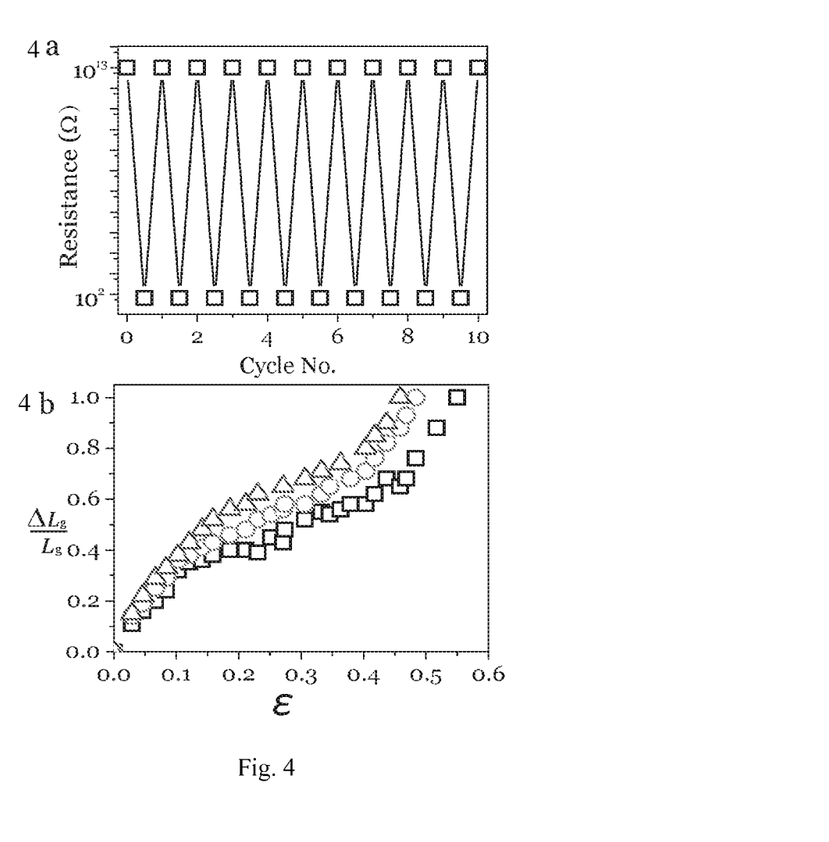
FIGS. 4a-4b. Reproducibility and rate dependence of device behavior, in accordance with an embodiment of the invention. 4(a) Measurements of device resistance through 10 cycles of alternating compression and relaxation show excellent reproducibility. 4(b) The evolution of compression in the gap and the switching strain are found to vary slightly with the average strain rate: $3.4 \times 10^{-3}$ $s^{-1}$ (squares), $1.7 \times 10^{-5}$ $s^{-1}$ (circles), $1.7 \times 10^{-5}$ $s^{-1}$ (triangles).

Characterization: The completed device was held at room temperature for 1 h prior to releasing the pre-stretch of the mounting layer. Incremental increases in nominal strain of 0.017 were applied to the sample by releasing the mounting layer pre-stretch by a fixed amount at regular intervals (5 sec in most cases, but also at 100 sec and 1000 sec for the data in FIG. 4) and situated for 15 min in room temperature. Sample surfaces were observed in situ using an upright optical microscope (Zeiss Axiotech Vario) in brightfield reflection mode, while a Zygo Newview 7300 optical profilometer was used to map surface profiles. Resistance measurements were conducted using a Keithley 4200 semiconductor parameter analyzer. A voltage sweep from −1 V to +1 V at a rate of 0.2 V/sec was used to determine the resistance.

The relevant teachings of all patents, published applications and reference cited herein are incorporated by reference in their entirety.

While this invention has been particularly shown and described with reference to example embodiments thereof, it will be understood by those skilled in the art that various changes in form and details may be made therein without departing from the scope of the invention encompassed by the appended claims.

What is claimed is:

1. A strain-gated electrical switch comprising at least two conductive electrodes disposed on a surface of an elastomer substrate, the at least two conductive electrodes forming a gap between the at least two electrodes in an off-state of the strain-gated electrical switch, the gap diminishing under compressive strain to form a crease, the compressive strain pressing the at least two electrodes into contact with each other in an on-state of the strain-gated electrical switch.

2. The strain-gated electrical switch of claim 1, wherein the at least two electrodes are gold electrodes.

3. The strain-gated electrical switch of claim 1, wherein the elastomer substrate is a polydimethyl siloxane (PDMS) elastomer substrate.

4. The strain-gated electrical switch of claim 1, wherein the gap between the at least two electrodes in the off-state of the strain-gated electrical switch is in a range of between about 1 μm and about 100 μm.

5. The strain-gated electrical switch of claim 4, wherein the gap between the at least two electrodes in the off-state of the strain-gated electrical switch is in a range of between about 10 μm and about 60 μm.

6. The strain-gated electrical switch of claim 5, wherein the gap between the at least two electrodes in the off-state of the strain-gated electrical switch is about 50 μm.

7. The strain-gated electrical switch of claim 1, wherein the at least two electrodes have a thickness in a range of between 5 nm and about 1 μm.

8. The strain-gated electrical switch of claim 7, wherein the at least two electrodes have a thickness in a range of between 20 nm and about 200 nm.

9. The strain-gated electrical switch of claim 8, the thickness of the at least two electrodes is about 100 nm.

10. The strain-gated electrical switch of claim 1, wherein the at least two electrodes have a width in a range of between about 1 µm and about 1 mm.

11. The strain-gated electrical switch of claim 10, wherein the at least two electrodes have a width in a range of between about 10 µm and about 1 mm.

12. The strain-gated electrical switch of claim 11, wherein the at least two electrodes have a width in a range of between about 20 µm and about 200 µm.

13. The strain-gated electrical switch of claim 12, wherein the width of the at least two electrodes is about 100 µm.

* * * * *